US009065484B2

(12) United States Patent
Sandberg et al.

(10) Patent No.: US 9,065,484 B2
(45) Date of Patent: *Jun. 23, 2015

(54) SYSTEMS AND METHODS FOR EFFICIENT LOW DENSITY PARITY CHECK (LDPC) DECODING

(71) Applicant: International Business Machines Corporation, Armonk, NY (US)

(72) Inventors: Melanie J. Sandberg, Cambridge, MA (US); Matthew M. Viens, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/034,288

(22) Filed: Sep. 23, 2013

(65) Prior Publication Data

US 2014/0026015 A1 Jan. 23, 2014

Related U.S. Application Data

(63) Continuation of application No. 12/360,748, filed on Jan. 27, 2009, now Pat. No. 8,560,917.

(51) Int. Cl.
*H03M 13/00* (2006.01)
*H03M 13/13* (2006.01)
*H03M 13/11* (2006.01)

(52) U.S. Cl.
CPC .......... *H03M 13/13* (2013.01); *H03M 13/1137* (2013.01)

(58) Field of Classification Search
CPC .. H03M 13/09; H03M 13/091; H04L 1/0061; H04L 1/0057; H04L 1/0045
USPC ........................................................ 714/758
See application file for complete search history.

(56) References Cited

U.S. PATENT DOCUMENTS

| | | | |
|---|---|---|---|
| 6,473,010 B1 | 10/2002 | Vityaev et al. | |
| 7,031,090 B2 | 4/2006 | Ichihara et al. | |
| 7,266,750 B1 | 9/2007 | Patapoutian et al. | |
| 7,941,737 B2 | 5/2011 | Gopalakrishnan et al. | |
| 8,429,483 B1 * | 4/2013 | Varnica et al. | 714/752 |
| 8,560,917 B2 | 10/2013 | Sandberg et al. | |
| 2003/0065989 A1 * | 4/2003 | Yedida et al. | 714/703 |
| 2003/0104788 A1 | 6/2003 | Kim | |

(Continued)

OTHER PUBLICATIONS

Oh et al., "Efficient Highly-Parallel Decoder Architecture for Quasi-Cyclic Low-Density Parity-Check Codes," 2007 IEEE, pp. 1855-1858.

(Continued)

*Primary Examiner* — Albert Decady
*Assistant Examiner* — Enam Ahmed
(74) *Attorney, Agent, or Firm* — Zilka-Kotab, PC (57) ABSTRACT

A method for low density parity code decoding according to one embodiment includes sequentially processing groups of variable node (vnode) values associated with a codeword using a plurality of vnode logic modules and outputting updated vnode values; storing the vnode values and updated vnode values in a vnode memory; sequentially processing groups of cnode values using a plurality of check node (cnode) logic modules and outputting updated vnode values; storing the (mode values and updated (mode values in a mode memory; and checking the codeword using the updated vnode values and the updated mode values.

18 Claims, 5 Drawing Sheets

(56) References Cited

U.S. PATENT DOCUMENTS

| | | |
|---|---|---|
| 2004/0240590 A1 | 12/2004 | Cameron et al. |
| 2005/0204256 A1 | 9/2005 | Yeh et al. |
| 2005/0273688 A1 | 12/2005 | Argon |
| 2005/0283707 A1 | 12/2005 | Sharon et al. |
| 2006/0085720 A1 | 4/2006 | Tran et al. |
| 2006/0115029 A1 | 6/2006 | Marrow |
| 2006/0123318 A1* | 6/2006 | Kim et al. ............... 714/758 |
| 2006/0190797 A1* | 8/2006 | Xin ........................ 714/758 |
| 2006/0242093 A1 | 10/2006 | Richardson et al. |
| 2006/0265634 A1 | 11/2006 | Silvus et al. |
| 2007/0061687 A1 | 3/2007 | Hwang |
| 2007/0113143 A1 | 5/2007 | Liao et al. |
| 2007/0283218 A1 | 12/2007 | Gopalakrishnan et al. |
| 2010/0122143 A1 | 5/2010 | Lee et al. |
| 2010/0174959 A1* | 7/2010 | No et al. ................ 714/746 |
| 2010/0192036 A1 | 7/2010 | Sandberg et al. |
| 2010/0269011 A1* | 10/2010 | Oh et al. ............... 714/752 |

OTHER PUBLICATIONS

Non-Final Office Action from U.S. Appl. No. 12/360,748 dated Dec. 7, 2011.

Final Office Action from U.S. Appl. No. 12/360,748 dated May 7, 2012.

Non-Final Office Action from U.S. Appl. No. 12/360,748 dated Dec. 17, 2012.

Notice of Allowance and Fee(s) Due from U.S. Appl. No. 12/360,748 dated Jun. 6, 2013.

Leiner, B. M. J., "LDPC Codes—a brief Tutorial," Apr. 8, 2005, pp. 1-19.

* cited by examiner

SYSTEMS AND METHODS FOR EFFICIENT LOW DENSITY PARITY CHECK (LDPC) DECODING

RELATED APPLICATIONS

This application is a continuation of U.S. patent application Ser. No. 12/360,748 filed Jan. 27, 2009, which is incorporated by reference.

BACKGROUND

The present invention relates to data storage systems, and more particularly, this invention relates to efficient low density parity check (LDPC) decoding.

In magnetic storage systems, data is read from and written onto magnetic recording media utilizing magnetic transducers commonly. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

A low density parity check (LDPC) code is an error correcting code used to transmit data over a transmission channel. In many magnetic storage systems, data is encoded utilizing LDPC code. As a result, when the data is read, the data must be decoded. However, decoding such data currently requires constant updating and a large amount of storage. Thus, current decoding techniques result in inefficient system operation.

SUMMARY

A method for low density parity code decoding according to one embodiment includes sequentially processing groups of variable node (vnode) values associated with a codeword using a plurality of vnode logic modules and outputting updated vnode values; storing the vnode values and updated vnode values in a vnode memory; sequentially processing groups of cnode values using a plurality of check node (cnode) logic modules and outputting updated vnode values; storing the cnode values and updated cnode values in a cnode memory; and checking the codeword using the updated vnode values and the updated cnode values.

A method for low density parity code decoding according to another embodiment includes processing variable node (vnode) values associated with a codeword using a plurality of vnode logic modules, and outputting updated vnode values, a number of the vnode logic modules being a fraction of a number of vnodes used in tow density parity code decoding, the fraction being less than $\frac{1}{1}$; storing the vnode values and updated vnode values in a vnode memory; sequentially processing groups of check node (cnode) values using a plurality of cnode logic modules for and outputting updated vnode values, a number of the mode logic modules being a fraction of a number of modes used in low density parity code decoding, the fraction being less than $\frac{1}{1}$; storing the cnode values and updated cnode values in a cnode memory; and checking the codeword using the updated vnode values and the updated cnode values.

A system for low density parity code decoding according to one embodiment includes a plurality of variable node (vnode) logic modules configured to concurrently update groups of vnode values associated with a codeword, the concurrent updating being performed sequentially until all groups are updated; a vnode memory for storing the updated vnode values; logic configured to determine whether the codeword is valid using the vnode values; logic configured to output an indication that the codeword is valid when the resulting codeword is valid. The system also includes logic configured to concurrently update groups of check node (cnode) values using a plurality of cnode logic modules, the concurrent updating being performed sequentially until all groups are updated when the resulting codeword is not valid; logic configured to store the cnode values in a cnode memory; logic configured to concurrently update the groups of vnode values based on the cnode values using the plurality of vnode logic modules, the concurrent updating being performed sequentially until all groups are updated; logic configured to store the updated vnode values in memory; and logic configured to determine whether the codeword is valid using the vnode values.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of hardware-based low density parity check (LDPC) decoding systems, as well as operation and/or component parts thereof.

In one general embodiment, a system for low density parity code decoding is provided, the system comprising: a plurality of variable node (vnode) logic modules for sequentially processing groups of vnode values associated with a codeword and outputting updated vnode values; a vnode memory for storing the vnode values and updated vnode values; a plurality of check node (cnode) logic modules for sequentially processing groups of cnode values and outputting updated vnode values; a cnode memory for storing the cnode values and updated cnode values; and logic for checking the codeword using the updated vnode values and the updated cnode values.

In another general embodiment, a system for low density parity code decoding is provided, the system comprising: a plurality of vnode logic modules for processing vnode values associated with a codeword and outputting updated vnode values, a number of the vnode logic modules being a fraction of a number of vnodes used by the system in low density parity code decoding, the fraction being less than $1/1$; a vnode memory for storing the vnode values and updated vnode values; a plurality of cnode logic modules for sequentially processing groups of cnode values and outputting updated vnode values, a number of the vnode logic modules being a fraction of a number of vnodes used by the system in low density parity code decoding, the fraction being less than $1/1$; a cnode memory for storing the cnode values and updated cnode values; and logic for checking the codeword using the updated vnode values and the updated cnode values.

In another general embodiment, a method for low density parity code decoding is provided, the method comprising: receiving a codeword; concurrently updating groups of vnode values using a plurality of vnode logic modules, the concurrent updating being performed sequentially until all groups are updated; storing the updated vnode values in a vnode memory; determining whether the codeword is valid using the vnode values; if the resulting codeword is valid, outputting an indication that the codeword is valid; and if the resulting codeword is not valid: concurrently updating groups of cnode values using a plurality of cnode logic modules, the concurrent updating being performed sequentially until all groups are updated; storing the cnode values in a cnode memory; concurrently updating the groups of vnode values based on the cnode values using the plurality of vnode logic modules, the concurrent updating being performed sequentially until all groups are updated; storing the updated vnode values in memory; and determining whether the codeword is valid using the vnode values.

As will be appreciated by one skilled in the art, the present invention may be embodied as a system, method or computer program product. Accordingly, the present invention may take the form of an entirely hardware embodiment, or an embodiment combining software and hardware aspects that may all generally be referred to herein as a "circuit," "module" or "system."

The flowchart and block diagrams in the Figures illustrate the architecture, functionality, and operation of possible implementations of systems and methods according to various embodiments of the present invention. In this regard, each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Figure 1:
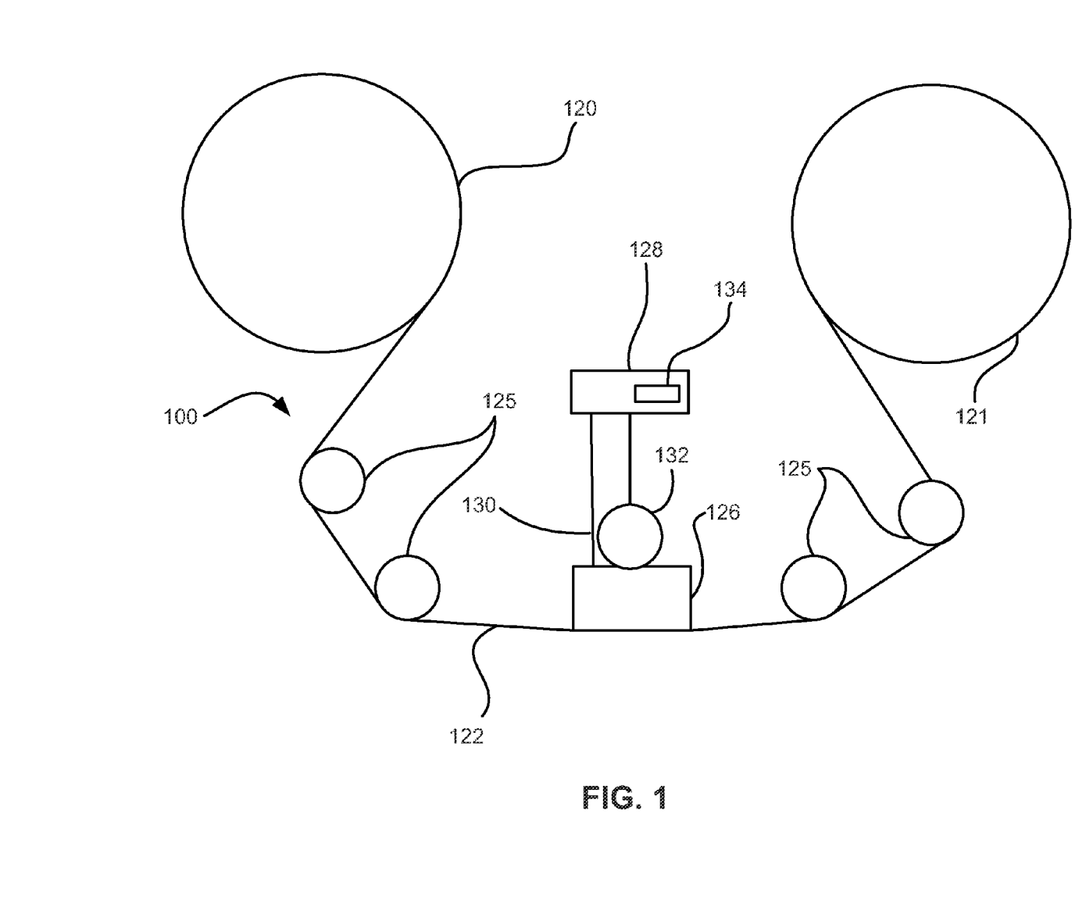
FIG. 1 is a schematic diagram of a simplified tape drive system according to one embodiment.

FIG. 1 illustrates a simplified tape drive 100 of a tape-based data storage system, which may be employed in the context of the present invention. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128, e.g., processor, typically controls head functions such as servo following, writing, reading, etc. and may be in communication with a computer-readable medium 134 such as a memory. The cable 130 may include read/write circuits to transmit data to the head 126 to be recorded on the tape 122 and to receive data read by the head 126 from the tape 122. An actuator 132 controls position of the head 126 relative to the tape 122.

An interface may also be provided for communication between the tape drive and a host (integral or external) to send and receive the data and for controlling the operation of the tape drive and communicating the status of the tape drive to the host, all as will be understood by those of skill in the art. Moreover, the tape drive 100 may form part of a tape library system comprising a plurality of drives and other components such as one or more pickers; a host processor or system (integral or external); user interface devices such as a display, keyboard, etc.

Tape-based data storage systems may utilize low density parity check (LDPC) code encoding algorithms for encoding data and LDPC code decoding algorithms for decoding the data. Low density parity check code is an iterative error-correcting code. The code generally includes a number of variable nodes (vnodes) and check nodes (cnodes) connected together. For decoding, a vnode is utilized to sum the inputs to the vnode with the original codeword input. A cnode finds the absolute value minimum of the inputs.

Often, a code may include 2000 vnodes and 1000 cnodes. While a single vnode may be small (e.g. not much more than a few adders), the design may become quite large when there are thousands of these vnodes combined. In addition, each connection between a vnode and a cnode may be a number that needs to be stored (e.g. a 6-bit number, etc.). If there are 2000 vnodes and 3 connections to each vnode, that is 6000 numbers to constantly update and store.

One relatively straightforward design may include 2000 copies of a vnode and 1000 copies of a cnode connected together. However, this requires a lot of space. Another design may include only one vnode and one cnode, where the vnode and cnode are reused for each vnode/cnode operation. This design requires many clock cycles per iteration and still requires storing all 6000 connection values.

Space may be saved by including a minimum number of vnodes/cnodes in a design, but there may also be a lot of additional logic for the multiplexing involved to route the different inputs and outputs to their respective storage locations. As an option, a number of vnodes/cnodes may be chosen and those vnodes/cnodes may be reused. In this case, the problem of storing many connection values and having to use space either for the adders of a vnode or the multiplexing to route the I/O may still remain.

Accordingly, LDPC decoder implementing an efficient design is provided. In one embodiment, the LDPC decoder may reuse vnodes and cnodes and store connection values into memory such as SRAMs. In this case, instead of performing the whole vnode update in one clock cycle, the vnodes may be divided into a number (n) of sets (e.g. 4 sets, 8 sets, 16 sets, etc.) and may be updated over n clock cycles. Any multiplexing may be kept to a minimum by keeping the vnode/cnode inputs in the correct order for processing. Each of the n groups may be read, processed, and stored in exactly the same manner.

Figure 2:
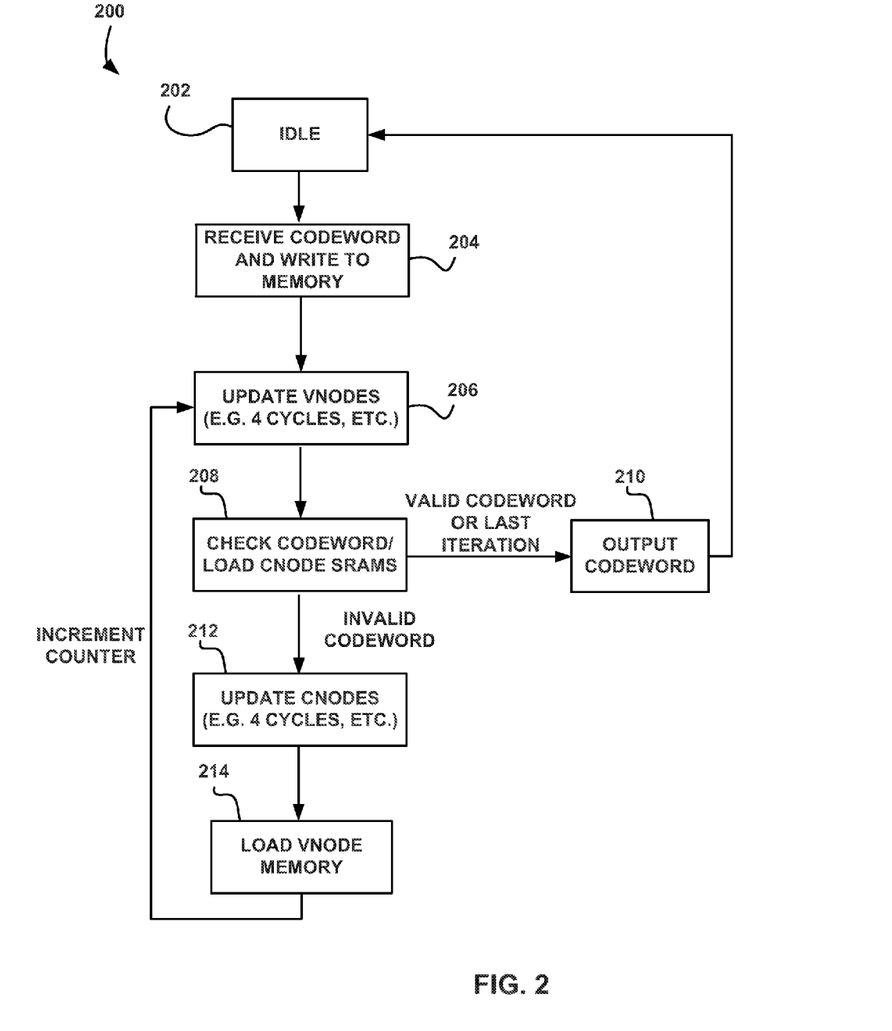
FIG. 2 shows a method for low density parity code decoding, in accordance with one embodiment.

FIG. 2 shows a method 200 for low density parity code decoding, in accordance with one embodiment. As an option, the present method 200 may be implemented in the context of the functionality and architecture of FIG. 1. Of course, however, the method 200 may be carried out in any desired environment.

As shown, a decoding system is idle until a new input codeword from a tape is received. See operations 202-204. This codeword is then written to memory. The codeword may include any string of encoded data received from the tape. After a new input codeword is accepted, the inputs to the vnodes are updated over a number (n) of clock cycles (e.g. 4, 8, 16 etc.). See operation 206.

In one embodiment, there may be a plurality of memory devices for storing all the values for the vnodes. For example, in one embodiment, two dual-port SRAMs may be utilized, though other types of memory can be used. In this case, each SRAM may only have two addresses, for a total of our addresses. Furthermore, the vnodes may be divided into four groups, with each set of inputs to the group of vnodes being stored in one of the SRAM addresses.

Each clock cycle, one group of inputs may be read out and processed through the vnode logic. The next clock cycle, those values may be stored back into the memory while the next group of inputs is simultaneously being processed.

Next, the new codeword value is checked to see if it is valid or if the operation should continue iterating. See operation 208. In one embodiment, the codeword may be checked for validity utilizing an H-matrix (i.e. a parity check matrix). If the new codeword value is valid or if it is determined that this is the last iteration, the codeword is output. See operation 210.

At the same time, the new codeword value is being checked for validity, all the connection values may be read from the vnode memory and may be mapped into the mode memory. In one embodiment, the connection values may be stored in order for the vnodes to minimize vnode logic and multiplexing.

Additionally, the connection values may be placed in the correct order for the modes to minimize the multiplexing associated with the cnodes. Thus, the connection values may be read from vnode memory, mapped to the correct order for the cnode memory, and stored in the cnode memory.

If, in operation 208, it is determined that the codeword is invalid, the cnodes are updated. See operation 212. The cnode updates may occur in the same manner as the vnodes, with the exception that cnode logic is utilized for the updating.

In this case, the cnode memory values may be read, updated, and stored. Moreover, all the cnode memory values may be read simultaneously and mapped into the vnode memory to start the process over again. See operation 214.

Thus, using the method 200, a codeword may be received and groups of vnode values may be updated concurrently using a plurality of vnode logic modules. In this case, the concurrent updating may be performed sequentially until all groups are updated. The updated vnode values may then be stored in a vnode memory.

Furthermore, it may be determined whether the codeword is valid using the vnode values. If the resulting codeword is valid, an indication that the codeword is valid may be output. If the resulting codeword is not valid, groups of cnode values may be updated concurrently using a plurality of cnode logic modules. In this case, the concurrent updating may be performed sequentially until all groups are updated. The cnode values may then be stored in a cnode memory.

Additionally, the groups of vnode values may be updated concurrently based on the cnode values using the plurality of vim& logic modules. In this case, the concurrent updating may be performed sequentially until all groups are updated. The updated vnode values may then be stored in memory. Again, it may be determined whether the codeword is valid using the vnode values.

Figure 3:
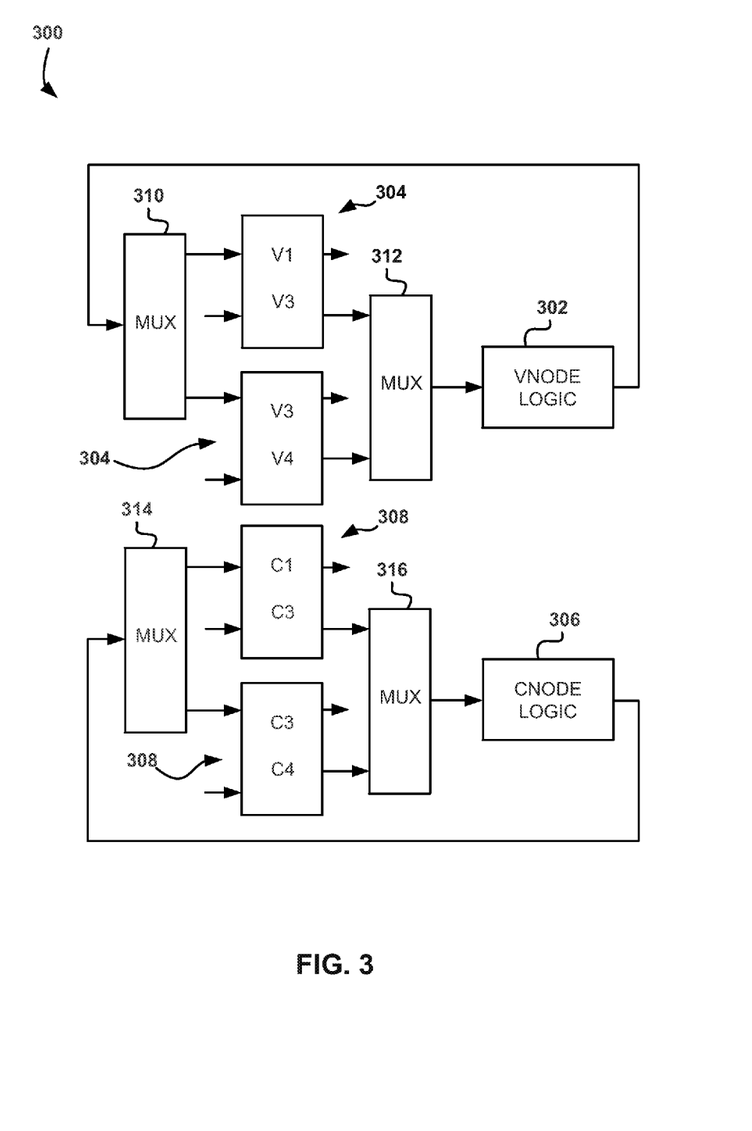
FIG. 3 shows a representative system for low density parity code decoding, in accordance with one embodiment.

FIG. 3 shows a system 300 for low density parity code decoding, in accordance with one embodiment. As an option, the present system 300 may be implemented to carry out the method 200 of FIG. 2. Of course, however, the system 200 may be implemented in any desired environment.

The system 300 may include a plurality of vnode logic modules 302 for sequentially processing groups of vnode values associated with a codeword and for outputting updated vnode values. Additionally, a vnode memory 304 is provided for storing the vnode values and the updated vnode values.

The system 300 may also include a plurality of mode logic modules 306 for sequentially processing groups of cnode values and for outputting updated vnode values. Additionally, a cnode memory 308 is provided for storing the cnode values and the updated cnode values. Still yet, logic may be provided for checking the codeword using the updated vnode values and the updated cnode values.

The vnode memory 304 and the cnode memory 308 may be any suitable memory. For example, in one embodiment, the vnode memory 304 and/or cnode memory 308 may be random access memory such as SRAM, DRAM, etc. Furthermore, the vnode logic modules 302 and the cnode logic modules 306 may be present in any device capable of implementing such logic. For example, in one embodiment, the vnode logic modules 302 and the cnode logic modules 306 may be present on a field programmable gate array (FPGA), application specific integrated circuit (ASIC), system of discrete components, etc.

Furthermore, in one embodiment, the vnode logic module 302 may further comprise a multiplexer 310 coupled to an input of the vnode memory 304 and a second multiplexer 312 coupled to an output of the vnode memory 304. Similarly, as an option, the cnode logic module 306 may further comprise a multiplexer 314 coupled to an input of the cnode memory 308 and a second multiplexer 316 coupled to an output of the cnode memory 308.

It should be noted that the logic for checking the codeword using the updated vnode values and the updated cnode values may be logic that is included in one or more of the devices illustrated in FIG. 3 or may be embodied on a separate logic module, where the logic module includes a tangible medium for embodying such logic. Additionally, in one embodiment, logic may be provided for parsing the vnode values into the groups. This logic may be embodied on an isolated device or a device illustrated in FIG. 3. Still yet, additional logic may be provided for mapping connection values from the vnode memory 304 to the cnode memory 308.

It should be noted that the functionality described in the context of FIG. 3 may be carried out utilizing one or more devices (e.g. multiplexers, logic modules, etc.). Furthermore, any number of memory modules may be utilized.

For example, in one embodiment, a plurality of vnode logic modules may be utilized for processing vnode values associated with a codeword and outputting updated vnode values. In this case, the number of the vnode logic modules may be a fraction of a number of vnodes used by the system 300 in low density parity code decoding, where the fraction is less than 1/1 (e.g., 1/2, 1/3, 1/4, etc.). Furthermore, a plurality of cnode logic modules may be utilized for sequentially processing groups of cnode values and outputting updated vnode values. In this case, the number of the cnode logic modules may be a fraction of a number of cnodes used by the system in low density parity code decoding, where the fraction is less than 1/1 (e.g., 1/2, 1/3, 1/4, etc.).

Figure 4:
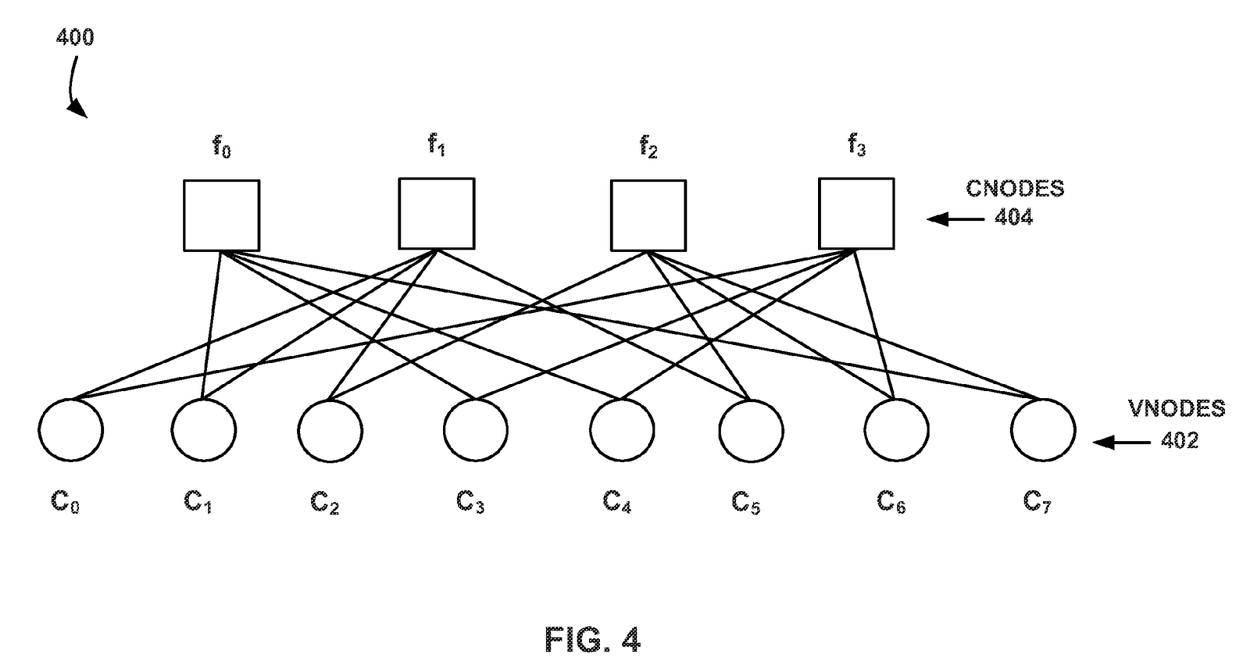
FIG. 4 shows a graph illustrating data flow for low density parity code decoding, in accordance with one embodiment.

FIG. 4 shows a graph 400 illustrating data flow for low density parity code decoding, in accordance with one embodiment. As an option, the graph 400 may be implemented in the context of the details of FIGS. 1-3. Of course, however, the graph 400 may be implemented in any desired environment.

As shown, the graph 400 includes a plurality of vnodes 402 and a plurality of cnodes 404. In one embodiment, the graph 400 may be created utilizing a parity check matrix (i.e. an H-matrix). In this case, the graph 400 may include in check nodes representing the number of parity bits, and n variable nodes representing the number of bits in a codeword. A check node is connected to variable node if a corresponding element in the parity matrix is equal to 1.

In operation, a codeword is provided from a tape. The codeword may include any string of data from the tape that has been encoded. For example, the codeword may have been encoded by an LDPC encoder.

The codeword servers as input to slots at the vnodes 402. As depicted in FIG. 4, eight slots (i.e. vnodes) are provided for inputting the codeword. However, in other embodiments, any number of vnodes may be utilized.

Once the codeword is input, it is determined whether the codeword is a valid codeword. In one embodiment, the determination may be accomplished utilizing a parity check matrix. If it is determined that the codeword is not a valid codeword, a series of iterations is performed to determine the probability that the codeword is another valid codeword.

As shown, each vnode 402 has two inputs. However, it should be noted that, in various other embodiments, the vnode may have any number of inputs. A vnode is utilized to sum the inputs with the original codeword input. Additionally, a mode is utilized to find the absolute value minimum of the inputs.

As an example, an error flee codeword may be c=[1 0 0 1 0 1 0 1]. However, in this case, the received codeword may have one error-bit c[1] flipped to 1 (i.e. c_error=[1 1 0 1 0 1 0 1]).

As a first step, all vnodes $c_i$ (where i=0, 1, 2, 3, etc.) send a "message" to their modes $f_j$ (where j=0, 1, 2, 3, etc.) containing the bit they believe to be the correct bit. At this stage, the only information a vnode $c_i$ has is the corresponding received i-th bit of c, $y_i$. That means, for example, that $c_0$ sends a message containing 1 to $f_1$ and $f_3$, node $c_i$ sends messages containing $y_1$ (1) to $f_0$ and $f_1$, etc.

As a second step, every check node $f_j$ calculates a response to every connected vnode. The response message contains the bit that $f_j$ believes to be the correct bit for this vnode $c_i$, assuming that the other vnodes connected to $f_j$ are correct. In other words, in this example, every mode $f_j$ is connected to 4 vnodes. Thus, a cnode $f_j$ examines the message received from three vnodes and calculates the bit that the fourth vnode should have in order to fulfill the parity check equation.

In some cases, this might be the point at which the decoding algorithm terminates. For example, if all check equations are fulfilled, the decoding algorithm may terminate. Additionally, the algorithm may include a loop and the decoding algorithm may terminate based on a threshold for the amount of loops.

In the next step, the vnodes 402 may receive the messages from the cnodes 404 and use this additional information to decide if their originally received bit is valid. In one embodiment, this may be accomplished using a majority vote. In the current example, that means that each vnode 404 has three sources of information concerning its bit, the original bit received, and two suggestions from the cnodes 404.

At this point, the vnodes 402 may send another message with their (hard) decision for the correct value to the cnodes 404. In this example, the second execution of this step would terminate the decoding process since $c_1$ has voted for 0 in the last step. This corrects the transmission error and all check equations are now satisfied.

Figure 5:
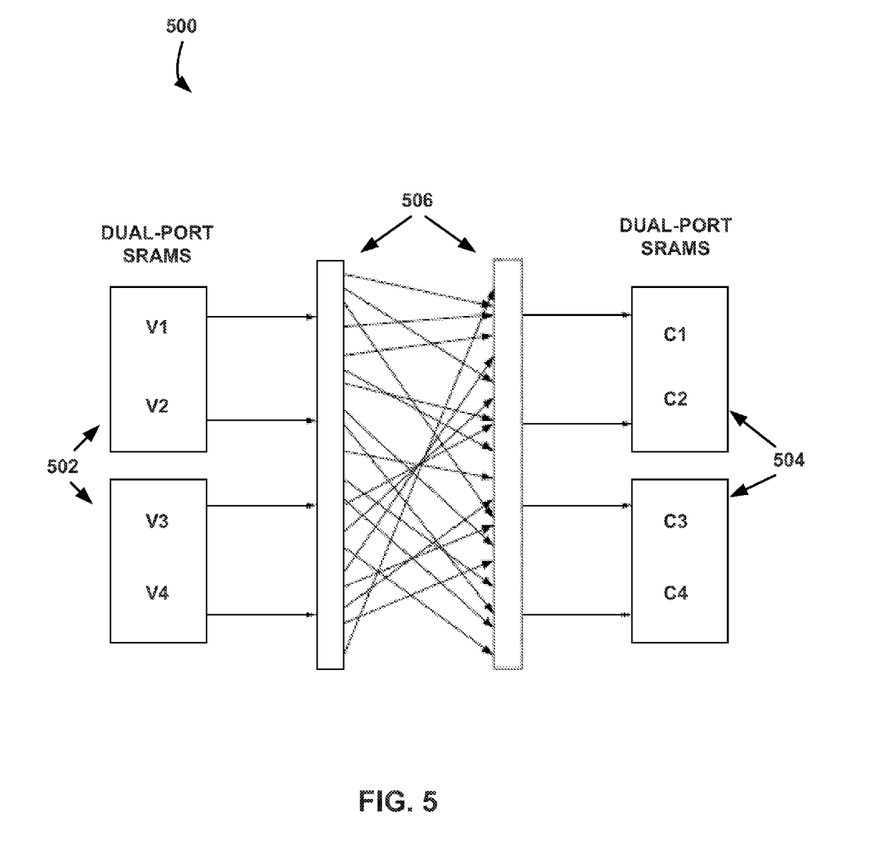
FIG. 5 shows a representative system illustrating mapping between variable node (vnode) and check node (cnode) memory, in accordance with one embodiment.

FIG. 5 shows a system 500 illustrating mapping between vnode and cnode memory, in accordance with one embodiment. As an option, the system 500 may be implemented in the context of the details of FIGS. 1-4. Of course, however, the system 500 may be implemented in any desired environment.

As shown, vnode memory 502 and cnode memory 504 are provided. The vnode memory 502 may be mapped to the cnode memory 504 utilizing one or more multiplexers 506 and associated logic. The mapping may include any type of mapping such as mapping ports, blocks, and cells associated with the vnode memory 502 to ports, blocks, and cells associated with the mode memory 504.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for low density parity code decoding, the method comprising:
    sequentially processing groups of variable node (vnode) values associated with a codeword using a plurality of vnode logic modules and outputting updated vnode values;
    storing the vnode values and updated vnode values in a vnode memory;
    sequentially processing groups of cnode values using a plurality of check node (cnode) logic modules and outputting updated vnode values;
    storing the cnode values and updated cnode values in a cnode memory; and
    checking the codeword using the updated vnode values and the updated cnode values,
    wherein a number of the vnode logic modules is a fraction of a number of vnodes used in low density parity code decoding, the fraction being less than 1/1.

2. The method of claim 1, wherein the vnode memory and cnode memory is random access memory.

3. The method of claim 1, wherein the vnode logic module further comprises a multiplexer coupled to an input of the vnode memory and a second multiplexer coupled to an output of the vnode memory.

4. The method of claim 1, wherein the cnode logic module further comprises a multiplexer coupled to an input of the cnode memory and a second multiplexer coupled to an output of the cnode memory.

5. The method of claim 1, further comprising parsing the vnode values into the groups.

6. The method of claim 1, further comprising mapping connection values from the vnode memory to the cnode memory.

7. A method for low density parity code decoding, the method comprising:
   processing variable node (vnode) values associated with a codeword using a plurality of vnode logic modules, and outputting updated vnode values, a number of the vnode logic modules being a fraction of a number of vnodes used in low density parity code decoding, the fraction being less than 1/1;
   storing the vnode values and updated vnode values in a vnode memory;
   sequentially processing groups of check node (cnode) values using a plurality of cnode logic modules, and outputting updated vnode values, a number of the cnode logic modules being a fraction of a number of cnodes used in low density parity code decoding, the fraction being less than 1/1;
   storing the cnode values and updated cnode values in a cnode memory; and
   checking the codeword using the updated vnode values and the updated cnode values.

8. The method of claim 7, wherein the vnode memory and cnode memory is random access memory.

9. The method of claim 7, wherein the vnode logic modules and cnode logic modules are present on a field programmable gate array or application specific integrated circuit.

10. The method of claim 7, wherein the vnode logic module further comprises a multiplexer coupled to an input of the vnode memory and a second multiplexer coupled to an output of the vnode memory.

11. The method of claim 7, wherein the cnode logic module further comprises a multiplexer coupled to an input of the cnode memory and a second multiplexer coupled to an output of the cnode memory.

12. The method of claim 7, further comprising mapping connection values from the vnode memory to the cnode memory.

13. A system for low density parity code decoding, comprising:
   a plurality of variable node (vnode) logic modules configured to concurrently update groups of vnode values associated with a codeword, the concurrent updating being performed sequentially until all groups are updated;
   a vnode memory for storing the updated vnode values;
   logic configured to determine whether the codeword is valid using the vnode values;
   logic configured to output an indication that the codeword is valid when the resulting codeword is valid;
   logic configured to concurrently update groups of check node (cnode) values using a plurality of cnode logic modules, the concurrent updating being performed sequentially until all groups are updated when the resulting codeword is not valid;
   logic configured to store the cnode values in a cnode memory;
   logic configured to concurrently update the groups of vnode values based on the cnode values using the plurality of vnode logic modules, the concurrent updating being performed sequentially until all groups are updated;
   logic configured to store the updated vnode values in memory; and
   logic configured to determine whether the codeword is valid using the vnode values,
   wherein a number of the vnode logic modules is a fraction of a number of vnodes used by the system in low density parity code decoding, the fraction being less than 1/1.

14. The system of claim 13, wherein the vnode logic modules and cnode logic modules are present on a field programmable gate array or application specific integrated circuit.

15. The system of claim 13, wherein a first vnode value of each of the groups is retrieved from the memory, processed, and stored again in the memory.

16. The system of claim 13, further comprising logic configured to map connection values from the vnode memory to the cnode memory.

17. The system of claim 13, wherein the vnode logic module further comprises a multiplexer coupled to an input of the vnode memory and a second multiplexer coupled to an output of the vnode memory.

18. The system of claim 13, wherein the cnode logic module further comprises a multiplexer coupled to an input of the cnode memory and a second multiplexer coupled to an output of the cnode memory.

* * * * *